United States Patent
Lin et al.

(10) Patent No.: US 10,539,981 B2
(45) Date of Patent: Jan. 21, 2020

(54) FOLDABLE TERMINAL

(71) Applicant: GUANGDONG OPPO MOBILE TELECOMMUNICATIONS CORP., LTD., Dongguan, Guangdong (CN)

(72) Inventors: Yugui Lin, Guangdong (CN); Jiao Cheng, Guangdong (CN); Weibin Yu, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 16/060,731

(22) PCT Filed: Dec. 29, 2016

(86) PCT No.: PCT/CN2016/112999
§ 371 (c)(1),
(2) Date: Jun. 8, 2018

(87) PCT Pub. No.: WO2017/114460
PCT Pub. Date: Jul. 6, 2017

(65) Prior Publication Data
US 2018/0364761 A1    Dec. 20, 2018

(30) Foreign Application Priority Data
Dec. 29, 2015  (CN) .......................... 2015 1 1026167

(51) Int. Cl.
*G06F 1/16* (2006.01)
*H04M 1/02* (2006.01)
*H05K 9/00* (2006.01)

(52) U.S. Cl.
CPC .......... *G06F 1/1652* (2013.01); *G06F 1/1616* (2013.01); *G06F 1/1656* (2013.01);
(Continued)

(58) Field of Classification Search
CPC ..................................................... G06F 1/1679
See application file for complete search history.

(56) References Cited

U.S. PATENT DOCUMENTS

| | | | |
|---|---|---|---|
| 6,366,440 B1 * | 4/2002 | Kung | E05C 19/16 361/147 |
| 6,653,919 B2 * | 11/2003 | Shih-Chung | G06F 1/162 24/303 |

(Continued)

FOREIGN PATENT DOCUMENTS

| | | |
|---|---|---|
| CN | 2662550 | 12/2004 |
| CN | 1722736 | 1/2006 |

(Continued)

OTHER PUBLICATIONS

WIPO, ISR for Application No. PCT/CN2016/112999, Jul. 6, 2017.
(Continued)

*Primary Examiner* — Adrian S Wilson
(74) *Attorney, Agent, or Firm* — Hodgson Russ LLP

(57) ABSTRACT

The present disclosure relates to a foldable terminal including a body, a magnetic attraction assembly and a magnetic buffer assembly. The body includes an upper part, a bending part and a lower part. The upper part is coupled with the bending part. The bending part is coupled with the lower part. When an included angle between the upper part and the lower part is 0 degree, the magnetic attraction assembly attracts. When the included angle between the upper part and the lower part is greater than or less than 180 degrees, members of the magnetic buffer assembly repel each other. The present disclosure further relates to another two kinds of foldable terminals.

16 Claims, 5 Drawing Sheets

(52) U.S. Cl.
CPC ........ *G06F 1/1679* (2013.01); *H04M 1/0214* (2013.01); *H04M 1/0268* (2013.01); *H04M 1/0277* (2013.01); *H05K 9/0075* (2013.01)

(56) References Cited

U.S. PATENT DOCUMENTS

| | | | | |
|---|---|---|---|---|
| 6,929,291 | B2* | 8/2005 | Chen | E05C 19/16 292/251.5 |
| 7,541,907 | B2* | 6/2009 | Wang | G06F 1/1632 335/214 |
| 8,705,229 | B2* | 4/2014 | Ashcraft | G06F 1/1679 312/223.1 |
| 9,161,469 | B2* | 10/2015 | Han | H05K 7/00 |
| 9,213,373 | B2* | 12/2015 | Lin | G06F 1/1669 |
| 2002/0154099 | A1* | 10/2002 | Oh | G06F 1/1626 345/173 |
| 2004/0190239 | A1* | 9/2004 | Weng | G06F 1/1616 361/679.2 |
| 2007/0121303 | A1* | 5/2007 | Wang | H04M 1/0222 361/752 |
| 2007/0133156 | A1* | 6/2007 | Ligtenberg | G06F 1/1616 361/679.27 |
| 2008/0125195 | A1* | 5/2008 | Maenpaa | H04M 1/0216 455/575.3 |
| 2008/0278269 | A1* | 11/2008 | Ramirez | E05C 19/16 335/205 |
| 2009/0103261 | A1* | 4/2009 | Shih | E05C 19/16 361/679.58 |
| 2010/0238620 | A1* | 9/2010 | Fish | G06F 1/1616 361/679.09 |
| 2013/0010405 | A1 | 1/2013 | Rothkopf et al. | |
| 2013/0329359 | A1* | 12/2013 | Andre | G06F 1/1616 361/679.55 |
| 2014/0011548 | A1* | 1/2014 | Varela | H04B 1/3888 455/566 |
| 2014/0376180 | A1 | 12/2014 | Chen et al. | |
| 2015/0241925 | A1 | 8/2015 | Seo et al. | |
| 2018/0188780 | A1* | 7/2018 | Perelli | G06F 1/1679 |
| 2018/0343330 | A1* | 11/2018 | Lin | H04M 1/0268 |

FOREIGN PATENT DOCUMENTS

| | | |
|---|---|---|
| CN | 2760726 | 2/2006 |
| CN | 1960612 A | 5/2007 |
| CN | 101677335 | 3/2010 |
| CN | 201947600 U | 8/2011 |
| CN | 103049054 | 4/2013 |
| CN | 203632709 | 6/2014 |
| CN | 104252202 | 12/2014 |
| CN | 204069046 | 12/2014 |
| CN | 105491194 | 4/2016 |
| EP | 2219347 | 8/2010 |
| JP | 2004110304 | 4/2004 |
| JP | 2006054807 | 2/2006 |
| JP | 3157053 | 1/2010 |
| JP | 2011119698 | 6/2011 |
| JP | 2014103631 | 6/2014 |
| KR | 20110048640 | 5/2011 |
| KR | 20150099383 | 8/2015 |

OTHER PUBLICATIONS

WIPO, English translation of the ISR/WO for PCT/CN2016/112999, Mar. 7, 2017.
EPO, Office Action for EP Application No. 16881249, dated Aug. 14, 2018.
USPTO, Notice of Allowance for U.S. Appl. No. 16/192,368, dated Aug. 5, 2019.
JPO, Office Action for JP Application No. 2018531405, dated May 21, 2019.
KIPO, Office Action for KR Application No. 10-2018-7017465, dated Aug. 16, 2019.
JPO, Office Action for JP Application No. 2018-531405, dated Oct. 25, 2019.
SIPO, First Office Action for CN Application No. 201810414036.2, dated Nov. 22, 2019.

* cited by examiner

FOLDABLE TERMINAL

CROSS-REFERENCE TO RELATED APPLICATION

The present application is a national phase entry under 35 USC § 371 of International Application PCT/CN2016/112999, filed Dec. 29, 2016, which claims the benefit of and priority to Chinese Patent Application No. 201511026167.6, filed Dec. 29, 2015, the entire disclosure of which is incorporated herein by reference.

FIELD

The present disclosure relates to a field of electronic apparatus, more particularly to a foldable terminal.

BACKGROUND

In comparison to a conventional screen, a flexible screen has obvious advantages, which is not only thinner and lighter in size, but also lower in power consumption than an original component, thereby facilitating improvement of the apparatus's endurance; and based on good bendability and flexibility properties of the flexible screen, durability of the flexible screen is also greatly higher than a traditional screen, thereby reducing the probability of accidental damage to the apparatus.

With a foldable terminal in the related art, a user is prone to closing it inadvertently due to its foldability, such that an inner folding surface of the foldable terminal may be damaged due to collision, thus reducing reliability of the foldable terminal.

SUMMARY

The present disclosure provides a foldable terminal including a body, a magnetic attraction assembly and a magnetic buffer assembly. The body includes an upper part, a bending part and a lower part. The upper part is coupled with the bending part. The bending part is coupled with the lower part. The magnetic attraction assembly includes a first magnetic attraction member and a second magnetic attraction member, the first magnetic attraction member is disposed to the upper part and away from the bending part, and the second magnetic attraction member is disposed to the lower part and away from the bending part. The magnetic buffer assembly includes a first magnetic buffer member and a second magnetic buffer member, the first magnetic buffer member is disposed to the upper part and adjacent to the bending part, and the second magnetic buffer member is disposed to the lower part and adjacent to the bending part. The present disclosure also provides another foldable terminal including a body, a magnetic attraction assembly and a magnetic buffer assembly. The body includes a bending part, and an upper part and a lower part coupled to two opposite sides of the bending part. The magnetic attraction assembly includes two magnetic attraction members attracting each other, the two magnetic attraction members are disposed to an end of the upper part away from the bending part and an end of the lower part away from the bending part correspondingly, and configured to maintain an attaching state between the upper part and the lower part. The magnetic buffer assembly includes two magnetic buffer members repelling each other, the two magnetic buffer members are disposed to an end of the upper part adjacent to the bending part and an end of the lower part adjacent to the bending part, and configured to provide a repulsive force when the upper part and the lower part approach each other.

The present disclosure also provides another foldable terminal including a body, a magnetic attraction assembly and a magnetic buffer assembly. The body includes a bending part, and an upper part and a lower part coupled to two opposite sides of the bending part. The magnetic attraction assembly includes a first magnetic attraction member and a second magnetic attraction member, the first magnetic attraction member being disposed to the upper part and away from the bending part, and the second magnetic attraction member being disposed to the lower part and away from the bending part. The magnetic buffer assembly includes a first magnetic buffer member and a second magnetic buffer member, the first magnetic buffer member being disposed between the first magnetic attraction member the bending part, and the second magnetic buffer member being disposed between the second magnetic attraction member and the bending part.

BRIEF DESCRIPTION OF THE DRAWINGS

To describe technical solutions in embodiments of the present disclosure more clearly, the following will briefly introduce the accompanying drawings required for the description of the embodiments. Obviously, the accompanying drawings described below show some embodiments of the present disclosure, and those skilled in the art can obtain other drawings based on these drawings without paying creative efforts.

DETAILED DESCRIPTION

Figure 1:
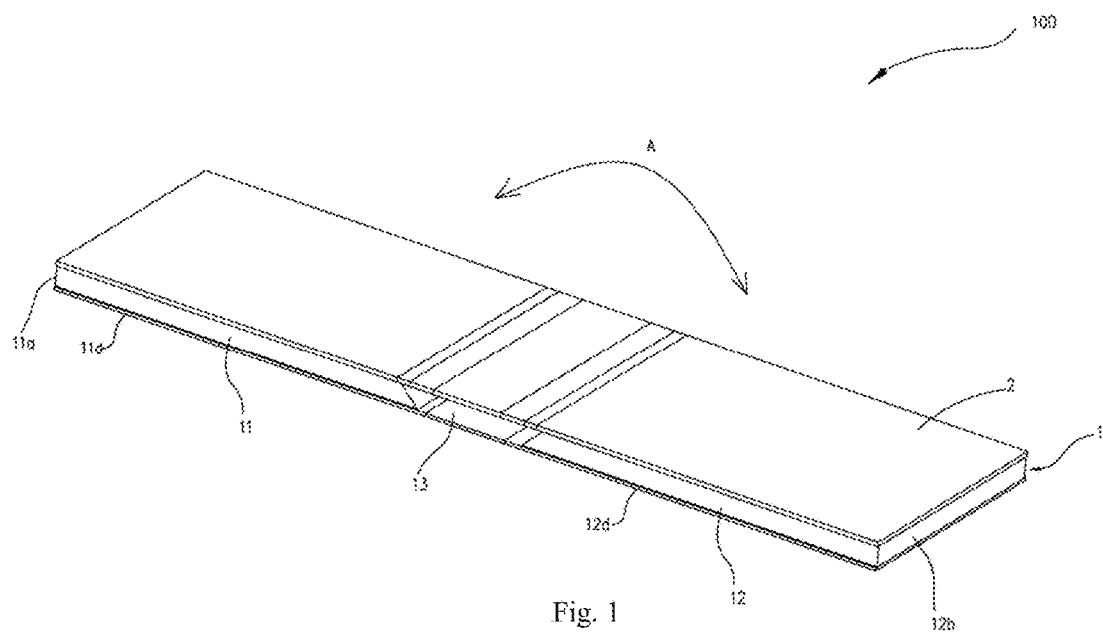
FIG. 1 is a schematic view of a foldable terminal according to an embodiment of the present disclosure.

Technical solutions in embodiments of the present disclosure will be clearly and completely described below with reference to the accompanying drawings in the embodiments of the present disclosure.

The present disclosure provides a foldable terminal including a body, a magnetic attraction assembly and a magnetic buffer assembly. The body includes an upper part, a bending part and a lower part. The upper part is coupled with the bending part. The bending part is coupled with the lower part. The magnetic attraction assembly includes a first magnetic attraction member and a second magnetic attraction member, the first magnetic attraction member is disposed to the upper part and away from the bending part, and the second magnetic attraction member is disposed to the lower part and away from the bending part. The magnetic buffer assembly includes a first magnetic buffer member and a second magnetic buffer member, the first magnetic buffer member is disposed to the upper part and adjacent to the bending part, and the second magnetic buffer member is disposed to the lower part and adjacent to the bending part.

The present disclosure also provides another foldable terminal including a body, a magnetic attraction assembly and a magnetic buffer assembly. The body includes a bending part, and an upper part and a lower part coupled to two opposite sides of the bending part. The magnetic attraction assembly includes two magnetic attraction members attracting each other, the two magnetic attraction members are disposed to an end of the upper part away from the bending part and an end of the lower part away from the bending part correspondingly, and configured to maintain an attaching state between the upper part and the lower part. The magnetic buffer assembly includes two magnetic buffer members repelling each other, the two magnetic buffer members are disposed to an end of the upper part adjacent to the bending part and an end of the lower part adjacent to the bending part, and configured to provide a repulsive force when the upper part and the lower part approach each other.

The present disclosure also provides another foldable terminal including a body, a magnetic attraction assembly and a magnetic buffer assembly. The body includes a bending part, and an upper part and a lower part coupled to two opposite sides of the bending part. The magnetic attraction assembly includes a first magnetic attraction member and a second magnetic attraction member, the first magnetic attraction member being disposed to the upper part and away from the bending part, and the second magnetic attraction member being disposed to the lower part and away from the bending part. The magnetic buffer assembly includes a first magnetic buffer member and a second magnetic buffer member, the first magnetic buffer member being disposed between the first magnetic attraction member the bending part, and the second magnetic buffer member being disposed between the second magnetic attraction member and the bending part.

A foldable terminal 100 according to embodiments of the present disclosure may be any apparatus having communication and storage functions, such as a tablet computer, a mobile phone, an electronic reader, a remote controller, a personal computer (PC), a notebook computer, an on-board apparatus, an internet television, a wearable apparatus, or other smart apparatuses having internet functions.

Referring to FIGS. 1 to 5, the foldable terminal 100 according to the present disclosure includes a body 1, a flexible screen assembly 2, a magnetic attraction assembly 3 and a magnetic buffer assembly 4. The body 1 includes an upper part 11 and a lower part 12 coupled to the upper part 11, and the upper part 12 and the lower part 11 are provided with a bending gap 14 therebetween.

The body 1 includes the upper part 11, a bending part 13 and the lower part 12. The upper part 11 is coupled with the bending part 13. The bending part 13 is coupled with the lower part 12. The body 1 includes an upper end and a lower end opposite to each other, the upper end is an end of the upper part 11 away from the bending part 13, and the lower end is an end of the lower part 12 away from the bending part 13.

The flexible screen assembly 2 is disposed to a surface of the body 1.

The magnetic attraction assembly 3 includes a first magnetic attraction member 31 and a second magnetic attraction member 32. The first magnetic attraction member 31 is disposed to the upper part 11 and adjacent to the upper end (i.e. away from the bending part 13). The second magnetic attraction member 32 is disposed to the lower part 12 and adjacent to the lower end (i.e. away from the bending part 13). When an included angle between the upper part 11 and the lower part 12 is 0 degree, the first magnetic attraction member 31 is attracted to the second magnetic attraction member 32.

The magnetic buffer assembly 4 includes a first magnetic buffer member 41 and a second magnetic buffer member 42. The first magnetic buffer member 41 is disposed to the upper part 11 and adjacent to the bending part 13. The second magnetic buffer member 42 is disposed to the lower part 12 and adjacent to the bending part 13. When the included angle between the upper part 11 and the lower part 12 is greater than or less than 180 degrees, the first magnetic buffer member 41 and the second magnetic buffer member 42 repel each other.

By providing the first magnetic buffer member 41 and the second magnetic buffer member 42 on the upper part 11 and the lower part 12 correspondingly, a user can sense a repulsive force between the first magnetic buffer member 41 and the second magnetic buffer member 42 when the upper part 11 is bent relative to the lower part 12 to prevent the foldable terminal 100 from closing vigorously and inadvertently, thereby improving reliability of the foldable terminal 100; meanwhile, by providing the first magnetic attraction member 31 and the second magnetic attraction member 32 to ends of the upper part 11 and the lower part 12 correspondingly, the first magnetic attraction member 31 is coupled to the second magnetic attraction member 32 when the included angle between the upper part 11 and the lower part 12 is 0 degree to maintain a bending state of the foldable terminal 100, thereby providing the foldable terminal 100 having high reliability and capable of maintaining an attaching state.

In the present embodiment, the body 1 includes the upper part 11, the bending part 13 and the lower part 12. The structures of the upper part 11 and the lower part 12 are substantially identical, and the difference is that electronic components 113 integrated inside the upper part 11 and the lower part 12 are different. The upper part 11 is now taken as an example for illustration, and a specific structure of the lower part 12 will not be described herein.

The upper part 11 includes a rectangular housing 111, a circuit board 112 and the electronic component 113, the electronic component 113 is integrated to the circuit board 112, and the circuit board 112 is fixedly disposed in the rectangular housing 111. The upper part 11 has a first upper end 11a and a first lower end 11b arranged opposite to each other, and a first surface 11c and a second surface 11d arranged opposite to each other. The first lower end 11b defines a first opening so as to be electrically coupled to the lower part 12. The lower part 12 has a second upper end 12a and a second lower end 12b arranged opposite to each other, and a third surface 12c and a fourth surface 12d arranged opposite to each other. The second upper end 12a defines a second opening.

The first surface 11c and the third surface 12c are located at one side of the body 1 and flush with each other to form an obverse surface 1a of the body 1, and the second surface 11d and the fourth surface 12d are located at another side of body 1 and flush with each other to form a back surface 1b of the body 1. The lower part 12 is electrically coupled to the upper part 11, and the lower part 12 and the upper part 11 are provided with the bending gap 14 therebetween so as to be coupled to the bending part 13, such that the body 1 can be bent into a bending state in which the first surface 11c is attached to the third surface 12c, or another bending state in which the second surface 11d is attached to the fourth surface 12d.

Figure 2:
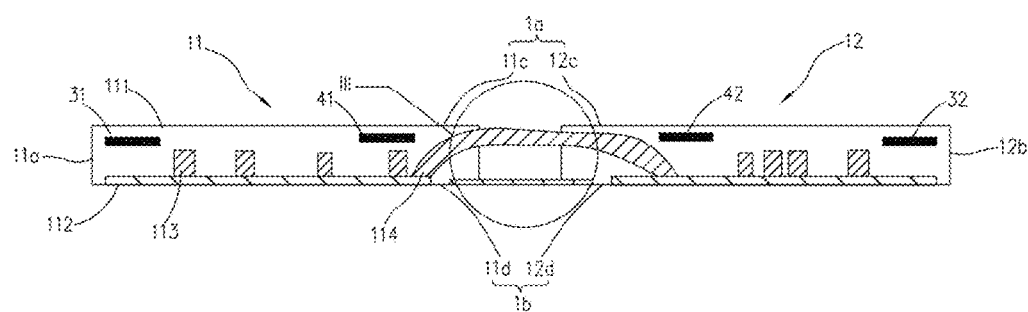
FIG. 2 is a schematic view of an interior of the foldable terminal illustrated in FIG. 1.
Figure 3:
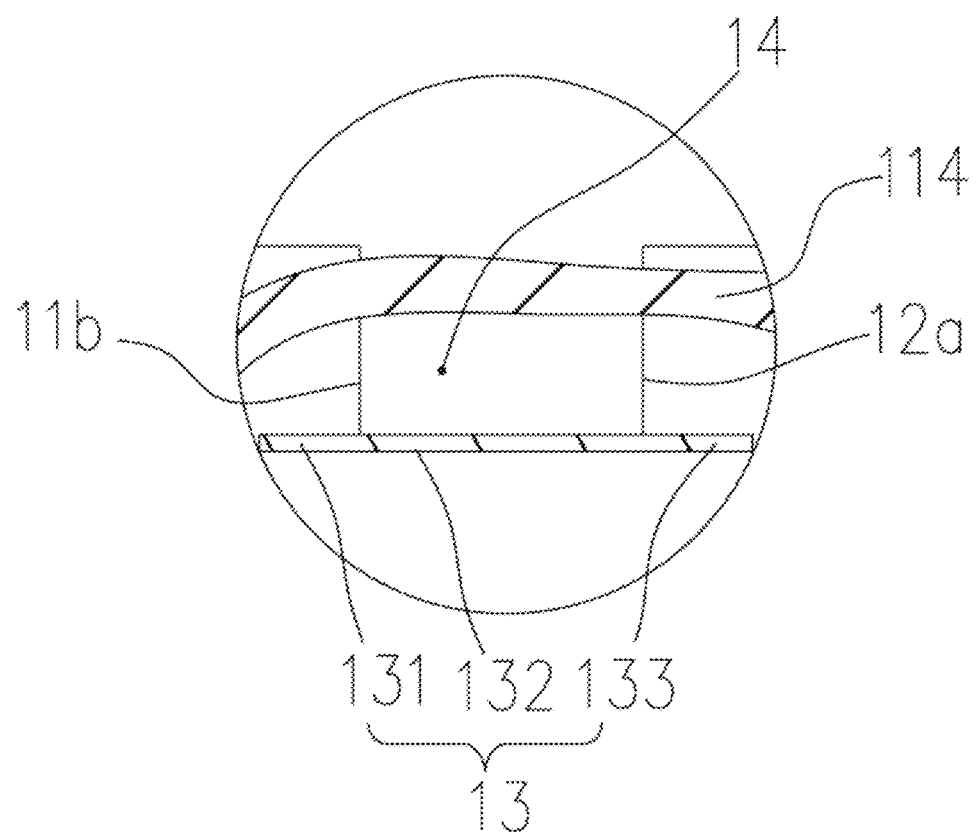
FIG. 3 is a schematic view of part III of the foldable terminal illustrated in FIG. 2.

Preferably, referring to FIGS. 2 and 3, an end of the flexible circuit board 114 extends into the first opening and is electrically coupled to the circuit board 112 in the upper part 11, and the other end of the flexible circuit board 114 extends into the second opening and is electrically coupled to an interior of the lower part 12, so as to achieve electrical coupling between the upper part 11 and the lower part 12, such that the upper part 11 and the lower part 12 can form a whole, and bending performance of a bending area can also be improved. Certainly, in other embodiments, the flexible circuit board 114 may also be replaced by a flat cable.

Further, the bending part 13 may be a sheet made of materials which can be bent repeatedly and has elasticity. By providing the bending part 13 of a sheet structure to surfaces of the upper part 11 and the lower part 12, an open-close angle between the upper part 11 and the lower part 12 can range from 0 to 360 degrees. In this way, the bending part 13 has a simple structure, thus facilitating assembling of the foldable terminal 100.

Preferably, the bending part 13 is a soft metal sheet, thereby further enhancing bending durability of the foldable terminal 100.

Specifically, in order to further improve a flatness of the surface of the body 1, an outer surface of the bending part 13 is flush with the back surface 1b of the body 1.

The bending part 13 resembles a strip, and includes an upper coupling section and a lower coupling section arranged opposite to each other. The upper coupling section is coupled to an interior of the first lower end 11b of the upper part 11 through a screw, the lower coupling section is coupled to an interior of the second upper end 12a of the lower part 12 through a screw, and the outer surface of the bending part 13 is flush with the back surface 1b of the body 1 when the bending part 13 is coupled to the surfaces of the upper part 11 and the lower part 12, thereby improving the flatness of the surface of the body 1. As the bending part 13 has elasticity and is stretchable, the open-close angle between the upper part 11 and the lower part 12 ranges from 0 to 360 degrees.

Figure 4:
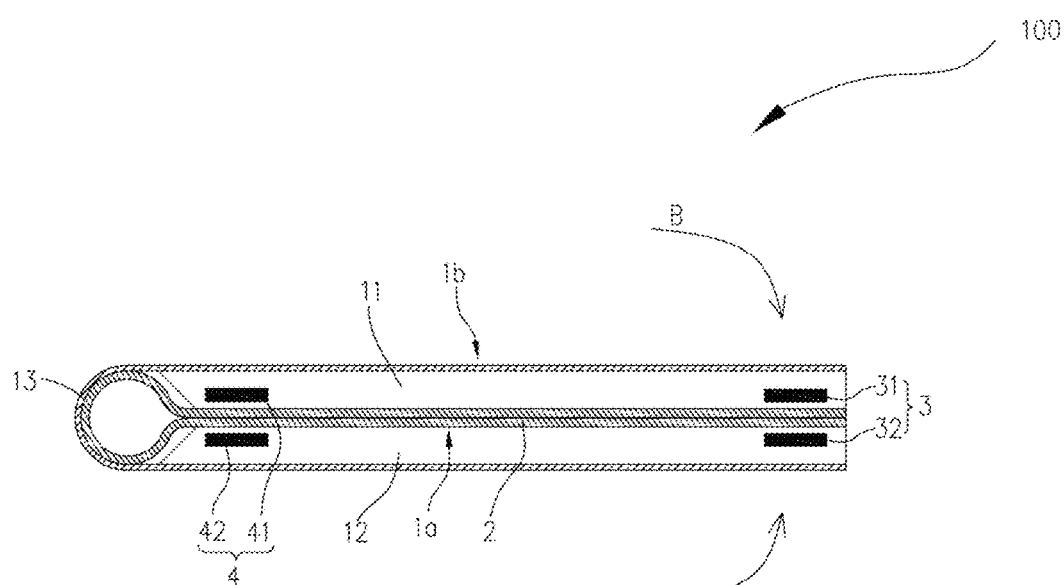
FIG. 4 is a schematic view of the foldable terminal illustrated in FIG. 1 in a second bending state.
Figure 5:
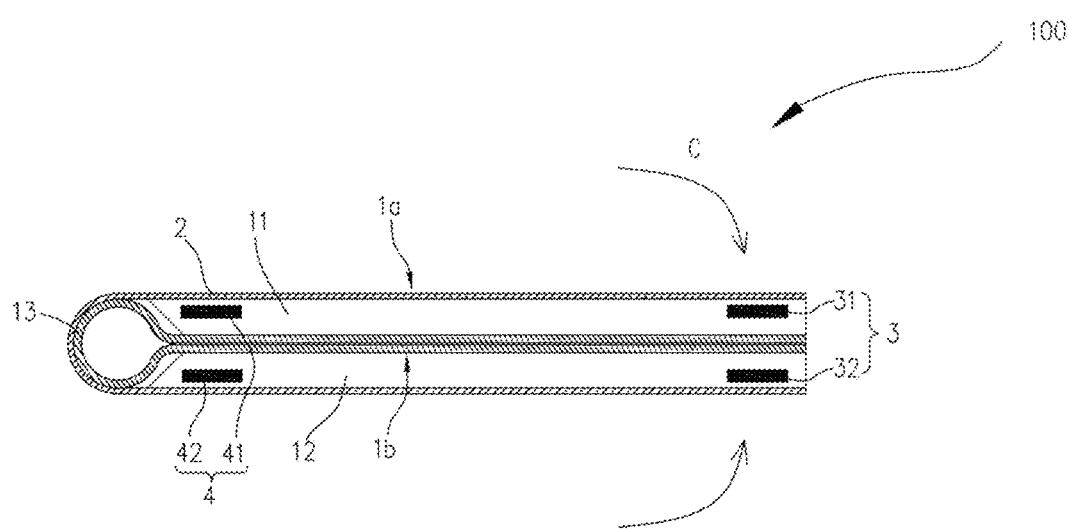
FIG. 5 is a schematic view of the foldable terminal illustrated in FIG. 1 in a third bending state.

In general, the foldable terminal 100 substantially has three bending states: in a first bending state A as illustrated in FIG. 1, the open-close angle between the upper part 11 and the lower part 12 is 180 degrees, and the foldable terminal 100 forms a linear shape; in a second bending state B as illustrated in FIG. 4, the open-close angle between the upper part 11 and the lower part 12 is 0 degree, the obverse surface 1a of the body 1 is an inner bending surface when the foldable terminal 100 is bent; in a third bending state C as illustrated in FIG. 5, the open-close angle between the upper part 11 and the lower part 12 is 0 degree, the back surface 1b of the body 1 is the inner bending surface when the foldable terminal 100 is bent. Certainly, in other embodiments, the bending part 13 may also be a silicone sheet, and the bending part 13 is adhered to the surfaces of the upper part 11 and the lower part 12. The bending part 13 may also be an elastic watch strap structure, or the like.

In the present embodiment, the flexible screen assembly 2 is disposed to the obverse surface 1a of the body 1. The flexible screen assembly 2 has a touch function, and the foldable terminal 100 can be interacted with by operating on the flexible screen assembly 2.

In the present embodiment, preferably, the first magnetic attraction member 31 is a magnet. The first magnetic attraction member 31 is fixedly disposed in the rectangular housing 111 of the upper part 11, adjacent to the first upper end 11a and adjacent to the first surface 11c, i.e. adjacent to the flexible screen assembly 2. The second magnetic attraction member 32 is a magnet. The second magnetic attraction member 32 is fixedly disposed in the rectangular housing 111 of the lower part 12, adjacent to the second lower end 12b, and adjacent to the third surface 12c, i.e. adjacent to the flexible screen assembly 2.

When the foldable terminal 100 is bent into the second bending state B, a strong magnetic force is present between the first magnetic attraction member 31 and the second magnetic attraction member 32, the first magnetic attraction member 31 and the second magnetic attraction member 32 are attracted together, such that the upper part 11 can be tightly attached to the lower part 12, that is, a folding of the foldable terminal 100 can be achieved, to reduce a size of the foldable terminal 100, thereby facilitating carrying of the foldable terminal 100.

In general, both of the first magnetic attraction member 31 and the second magnetic attraction member 32 are made of magnets, such that coupling performance of the magnetic attraction assembly 3 can be further improved.

It should be understood that, the first magnetic attraction member 31 is the magnet and is disposed inside the upper part 11, and the second magnetic attraction member 32 is iron.

It should be understood that, the first magnetic attraction member 31 is iron and is disposed inside the upper part 11, and the second magnetic attraction member 32 is the magnet and disposed inside the lower part 12.

Preferably, the first magnetic attraction member 31 and the second magnetic attraction member 32 are adhered to the upper part 11 and the lower part 12 correspondingly. In this arrangement, fixing of the magnetic attraction assembly 3 can be further simplified, and coupling strength between the magnetic attraction assembly 3 and the foldable terminal 100 can be improved.

In the present embodiment, the first magnetic buffer member 41 is disposed inside the rectangular housing 111 of the upper part 11 and adjacent to the first lower end 11b; the second magnetic buffer member 42 is disposed inside the lower part 12 and adjacent to the second upper end 12a. When the foldable terminal 100 is changed from the first bending state A to the second bending state B or the third bending state C, the user will realize that he/she is closing the foldable terminal 100 due to the repulsive force of the magnetic buffer assembly 4, so as to reduce the probability of damage to the foldable terminal 100 which is caused by a collision between the upper part 11 and the lower part 12 when the foldable terminal 100 is closed vigorously and inadvertently by the user, such that the reliability of the foldable terminal 100 is further improved.

Preferably, the first magnetic buffer member 41 and the second magnetic buffer member 42 are adhered to the upper part 11 and the lower part 12 correspondingly. In this arrangement, fixing of the magnetic buffer assembly 4 can be further simplified, and coupling strength between the magnetic buffer assembly 4 and the foldable terminal 100 can be improved.

For a further improvement, both of the first magnetic attraction member 31 and the second magnetic attraction member 32 are strip-shaped; or the first magnetic attraction member 31 is strip-shaped, and the second magnetic attraction member 32 is cylindrical.

Figure 6:
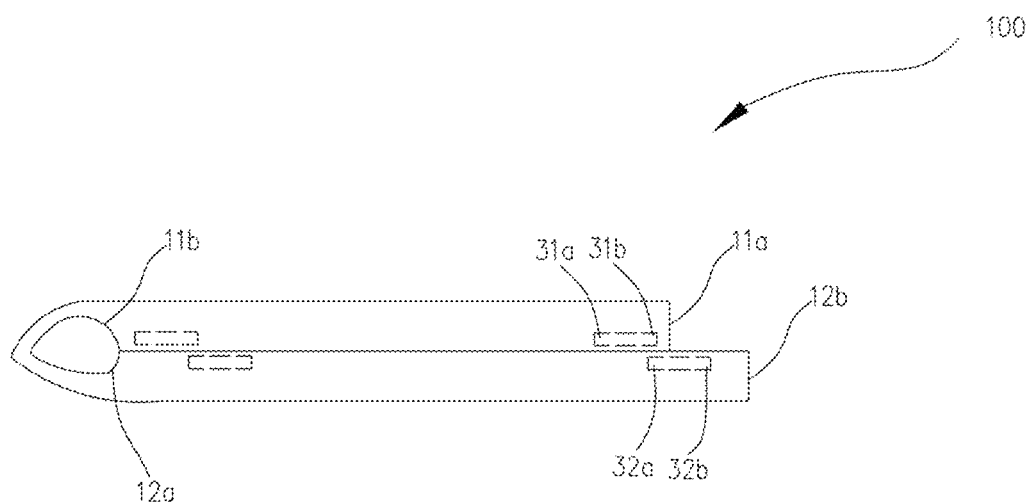
FIG. 6 is a schematic view of a magnetic attraction assembly of the foldable terminal illustrated in FIG. 4 in a coupling position.
Figure 7:
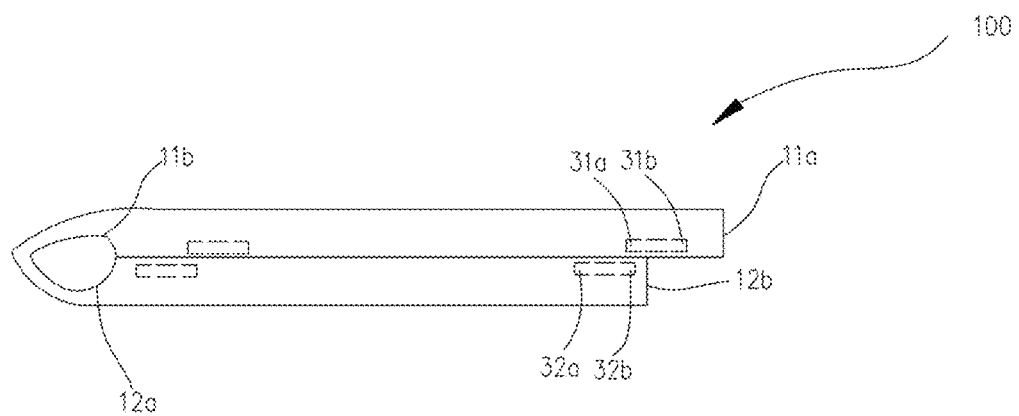
FIG. 7 is a schematic view of a magnetic attraction assembly of the foldable terminal illustrated in FIG. 4 in another coupling position.

In the present embodiment, referring to FIGS. 6 and 7, both of the first magnetic attraction member 31 and the second magnetic attraction member 32 are strip-shaped, alignment difficulty of the first magnetic attraction member 31 and the second magnetic attraction member 32 is further reduced. Referring to FIG. 6, the first magnetic attraction member 31 includes a first attaching part 31a and a second attaching part 31b arranged opposite to each other in an extending direction from the first upper end 11a to the first lower end 11b, the second magnetic attraction member 32 includes a third attaching part 32a and a fourth attaching part 32b arranged opposite to each other in an extending direction from the second upper end 12a to the second lower end 12b, and the second attaching part 31b may be magnetically attached to the third attaching part 32a by changing the bending shape of the body 1; or, referring to FIG. 7, the first attaching part 31a may be magnetically attached to the fourth attaching part 32b, etc. Certainly, in other embodiments, the first magnetic attraction member 31 may also be strip-shaped, and the second magnetic attraction member 32 is cylindrical.

For a further improvement, both of the first magnetic buffer member 41 and the second magnetic buffer member 42 are strip-shaped; or the first magnetic buffer member 41 is strip-shaped, and the second magnetic buffer member 42 is cylindrical.

In the present embodiment, both of the first magnetic buffer member 41 and the second magnetic buffer member 42 are strip-shaped, the alignment difficulty of the first magnetic buffer member 41 and the second magnetic buffer member 42 can be further reduced. Certainly, in other embodiments, the first magnetic buffer member 41 may also be strip-shaped, and the second magnetic buffer member 42 is cylindrical.

Figure 8:
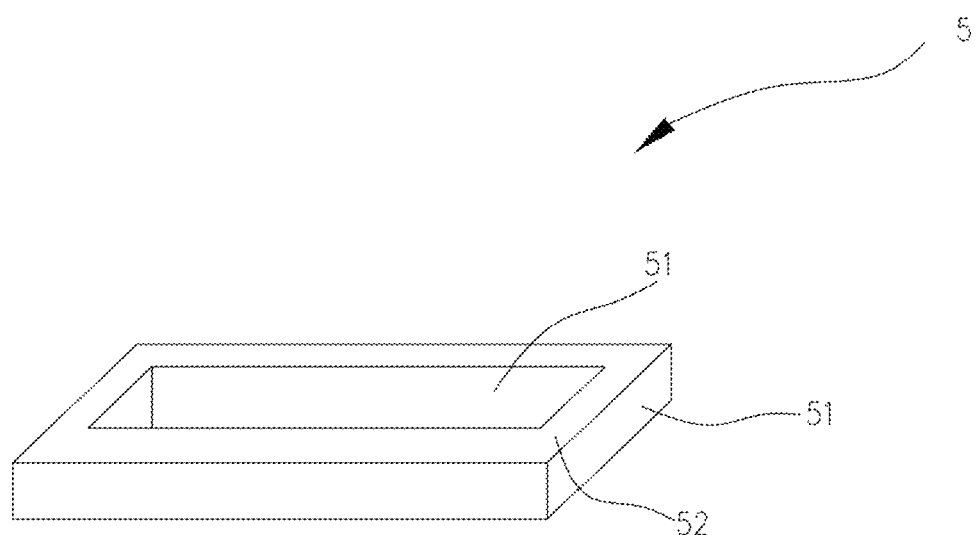
FIG. 8 is a schematic view of a ferromagnetic shielding assembly of the foldable terminal illustrated in FIG. 1.

For a further improvement, referring to FIG. 8, the foldable terminal 100 also includes four ferromagnetic shielding members 5, and the four ferromagnetic shielding members 5 surround circumferential surfaces of the first magnetic attraction member 31, the second magnetic attraction member 32, the first magnetic buffer member 41 and the second magnetic buffer member 42 correspondingly.

By providing the ferromagnetic shielding members 5 to the circumferential surfaces of the first magnetic attraction member 31, the second magnetic attraction member 32, the first magnetic buffer member 41 and the second magnetic buffer member 42 correspondingly, influence of the magnetic attraction assembly 3 and the magnetic buffer assembly 4 on other electronic components 113 in the housing of the foldable terminal 100 can be further reduced.

In the present embodiment, preferably, in order to further reduce the influence of the magnetic attraction assembly 3 on other electronic components 113 in the housing of the foldable terminal 100, the ferromagnetic shielding member 5 includes two iron frame casings 51 and foam 52. One iron frame casing 51 is fitted in the other iron frame casing 51, the two iron frame casings 51 define a filling gap therebetween, and the foam 52 is clamped in the filling gap. Specifically, the two iron frame casings 51 have the same shape, the difference is that one of the two iron frame casings 51 is smaller, and the other is larger. Accordingly, the smaller iron frame casing 51 is disposed in the larger iron frame casing 51, and the filling gap for filling the foam 52 is formed between circumferential surfaces of the two iron frame casings 51. Preferably, in order to further enhance ferromagnetic shielding performance of the ferromagnetic shielding member 5, a wall thickness of the iron frame casing 51 is 0.5 mm, and the filling gap is 10 mm. The four ferromagnetic shielding members 5 are disposed to the circumferential surfaces of the first magnetic attraction member 31, the second magnetic attraction member 32, the first magnetic buffer member 41 and the second magnetic buffer member 42 correspondingly, such that magnetism of the magnetic attraction members and the magnetic buffer members will not influence the electronic components 113 in the foldable terminal 100, such as a compass or a gravity sensor. Certainly, in other embodiments, the ferromagnetic shielding member 5 is an anti-magnetic hood. The four ferromagnetic shielding members 5 cover the first magnetic attraction member, the second magnetic attraction member, the first magnetic buffer member and the second magnetic buffer member correspondingly, so as to further reduce the influence of the magnetic attraction assembly 3 and the magnetic buffer assembly 4 on other electronic components 113 in the housing of the foldable terminal 100.

When the foldable terminal 100 is in use, the upper part 11 can be bent to 180 degrees (at least greater than 0 degree) relative to the lower part 12 by overcoming a magnetic attraction force between the first magnetic attraction member 31 and the second magnetic attraction member 32, and the foldable terminal 100 can be interacted with by clicking and touching the flexible screen assembly 2; when the foldable terminal 100 is not in use and the flexible screen assembly 2 of the foldable terminal 100 is not desired to be exposed, the foldable terminal 100 can be bought into the second bending state B, during the bending of the foldable terminal 100, the first magnetic buffer member 41 and the second magnetic buffer member 42 of the magnetic buffer assembly 4 repels each other to perform a fool-proof reminder for the user, and the repulsive force between the first magnetic buffer member 41 and the second magnetic buffer member 42 of the magnetic buffer assembly 4 is continued to be overcome to make the first magnetic attraction member 31 magnetically attracted to the second magnetic attraction member 32, such that the foldable terminal 100 is kept in the second bending state B; and when the foldable terminal 100 is not in use but the flexible screen assembly 2 of the foldable terminal 100 is desired to be exposed, the body 1 is bent to bring the foldable terminal 100 into the third bending state C.

In the foldable terminal 100 according to the present disclosure, by providing the first magnetic buffer member 41 and the second magnetic buffer member 42 on the upper part 11 and the lower part 12 correspondingly, the user can sense the repulsive force between the first magnetic buffer member 41 and the second magnetic buffer member 42 when the upper part 11 is bent relative to the lower part 12 to prevent the foldable terminal 100 from closing vigorously and inadvertently, thereby improving the reliability of the foldable terminal 100; meanwhile, by providing the first magnetic attraction member 31 and the second magnetic attraction member 32 to ends of the upper part 11 and the lower part 12 correspondingly, the first magnetic attraction member 31 is coupled to the second magnetic attraction member 32 when the included angle between the upper part 11 and the lower part 12 is 0 degree to maintain the bending state of the foldable terminal 100, thereby providing the foldable terminal 100 having high reliability and capable of maintaining the attaching state.

In the foldable terminal 100 according to the present disclosure, by further making the outer surface of the bending part 13 flush with the back surface 1b of the body 1, the flatness of the surface of the body 1 is further improved.

In the foldable terminal 100 according to the present disclosure, by further providing the ferromagnetic shielding members 5 to the circumferential surfaces of the magnetic attraction assembly 3 and the magnetic buffer assembly 4 correspondingly, the influence of the magnetic attraction assembly 3 and the magnetic buffer assembly 4 on other electronic components 113 in the housing of the foldable terminal 100 can be further reduced.

The above reveals preferred embodiments of the present disclosure, it should be noted that, it is also possible for those skilled in the art to further make some improvements and modifications without departing from the principle of the present disclosure, and these improvements and modifications are deemed to fall into the scope of the present disclosure.

What is claimed is:

1. A foldable terminal, comprising a body, a magnetic attraction assembly and a magnetic buffer assembly;
    the body comprising an upper part, a bending part and a lower part, the upper part being coupled with the bending part, the bending part being coupled with the lower part;
    the magnetic attraction assembly comprising a first magnetic attraction member and a second magnetic attraction member, the first magnetic attraction member being disposed to the upper part and away from the bending part; the second magnetic attraction member being disposed to the lower part and away from the bending part;
    the magnetic buffer assembly comprising a first magnetic buffer member and a second magnetic buffer member, the first magnetic buffer member being disposed to the upper part and adjacent to the bending part; the second magnetic buffer member being disposed to the lower part and adjacent to the bending part;
    wherein the foldable terminal further comprises four ferromagnetic shielding members surrounding circumferential surfaces of the first magnetic attraction member, the second magnetic attraction member, the first magnetic buffer member and the second magnetic buffer member correspondingly, and each of the ferromagnetic shielding member comprises foam and two iron frame casings, one iron frame casing is fitted in the other iron frame casing, and the foam is clamped between the two iron frame casings.

2. The foldable terminal according to claim 1, further comprising a flexible screen assembly disposed to a surface of the body.

3. The foldable terminal according to claim 1, wherein at least one selected from a group consisting of the magnetic attraction assembly and the magnetic buffer assembly is adhered to the body.

4. The foldable terminal according to claim 1, wherein the first magnetic attraction member comprises a first attaching part and a second attaching part spaced apart from each other, and the second magnetic attraction member is attached to at least one selected from a group consisting of the first attaching part and the second attaching part.

5. The foldable terminal according to claim 4, wherein the first magnetic attraction member is strip-shaped.

6. The foldable terminal according to claim 1, wherein the second magnetic attraction member comprises a third attaching part and a fourth attaching part spaced apart from each other, and the first magnetic attraction member is attached to at least one selected from a group consisting of the third attaching part and the fourth attaching part.

7. The foldable terminal according to claim 6, wherein the second magnetic attraction member is strip-shaped.

8. The foldable terminal according to claim 1, wherein the ferromagnetic shielding member is an anti-magnetic hood.

9. The foldable terminal according to claim 1, wherein the upper part and the lower part are provided with a flat cable therebetween.

10. The foldable terminal according to claim 1, wherein the bending part is a sheet, coupled between the upper part and the lower part, and arranged opposite to a flexible screen assembly.

11. The foldable terminal according to claim 10, wherein an outer surface of the bending part is flush with surfaces of the upper part and the lower part.

12. A foldable terminal, comprising a body, a magnetic attraction assembly and a magnetic buffer assembly;
    the body comprising a bending part, and an upper part and a lower part coupled to two opposite sides of the bending part;
    the magnetic attraction assembly comprising two magnetic attraction members attracting each other, the two magnetic attraction members being disposed to an end of the upper part away from the bending part and an end of the lower part away from the bending part correspondingly, and configured to maintain an attaching state between the upper part and the lower part;
    the magnetic buffer assembly comprising two magnetic buffer members repelling each other, the two magnetic buffer members being disposed to an end of the upper part adjacent to the bending part and an end of the lower part adjacent to the bending part correspondingly, and configured to provide a repulsive force when the upper part and the lower part approach each other;
    wherein the foldable terminal further comprises a plurality of ferromagnetic shielding members surrounding circumferential surfaces of the two magnetic attraction members and the two magnetic buffer members correspondingly to achieve electromagnetic shielding, and each ferromagnetic shielding member comprises two iron frame casings nested with each other and foam clamped between the two iron frame casings.

13. The foldable terminal according to claim 12, wherein the two magnetic attraction members are at least partially attached to each other.

14. The foldable terminal according to claim 12, wherein at least one of the magnetic attraction members comprises two attaching parts spaced apart from each other, and the other magnetic attraction member is attached to at least one of the attaching parts.

15. The foldable terminal according to claim 12, wherein at least one of the magnetic attraction member is a magnet.

16. A foldable terminal, comprising a body, a magnetic attraction assembly and a magnetic buffer assembly;
    the body comprising a bending part, and an upper part and a lower part coupled to two opposite sides of the bending part;
    the magnetic attraction assembly comprising a first magnetic attraction member and a second magnetic attraction member, the first magnetic attraction member being disposed to the upper part and away from the bending part; the second magnetic attraction member being disposed to the lower part and away from the bending part;
    the magnetic buffer assembly comprising a first magnetic buffer member and a second magnetic buffer member, the first magnetic buffer member being disposed between the first magnetic attraction member the bending part; the second magnetic buffer member being disposed between the second magnetic attraction member and the bending part;

wherein the foldable terminal further comprises a plurality of ferromagnetic shielding members surrounding circumferential surfaces of the first magnetic attraction member, the second magnetic attraction member, the first magnetic buffer member, and the second magnetic buffer member correspondingly to achieve electromagnetic shielding, and each ferromagnetic shielding member comprises two iron frame casings nested with each other and foam clamped between the two iron frame casings.

\* \* \* \* \*